(12) United States Patent
Ma et al.

(10) Patent No.: US 12,094,888 B2
(45) Date of Patent: Sep. 17, 2024

(54) ARRAY SUBSTRATE

(71) Applicant: WUHAN CHINA STAR OPTOELECTRONICS TECHNOLOGY CO., LTD., Wuhan (CN)

(72) Inventors: Tao Ma, Wuhan (CN); Yong Xu, Wuhan (CN); Wanglin Wen, Wuhan (CN); Fei Ai, Wuhan (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 699 days.

(21) Appl. No.: 17/278,722

(22) PCT Filed: Feb. 5, 2021

(86) PCT No.: PCT/CN2021/075385
§ 371 (c)(1),
(2) Date: Mar. 23, 2021

(87) PCT Pub. No.: WO2022/156004
PCT Pub. Date: Jul. 28, 2022

(65) Prior Publication Data
US 2023/0113882 A1    Apr. 13, 2023

(30) Foreign Application Priority Data
Jan. 25, 2021    (CN) .......................... 202110097489.9

(51) Int. Cl.
*H01L 27/12*    (2006.01)
*H01L 29/786*    (2006.01)

(52) U.S. Cl.
CPC ...... *H01L 27/1244* (2013.01); *H01L 27/1222* (2013.01); *H01L 27/1288* (2013.01); *H01L 29/78675* (2013.01)

(58) Field of Classification Search
CPC ............. H01L 27/1244; H01L 27/1222; H01L 27/1288; H01L 27/1248; H01L 27/124;
(Continued)

(56) References Cited

U.S. PATENT DOCUMENTS

2006/0022203 A1* 2/2006 Misaki ............. H01L 29/41733
257/E29.147
2010/0127266 A1   5/2010 Saito et al.
(Continued)

FOREIGN PATENT DOCUMENTS

CN    102315279 A    1/2012
CN    105845721 A    8/2016
(Continued)

OTHER PUBLICATIONS

K. Hoshino, H. Yagi and H. Tsuchikawa, "TiN-encapsulized copper interconnects for ULSI applications," Proceedings., Sixth International IEEE VLSI Multilevel Interconnection Conference, Santa Clara, CA, USA, 1989, pp. 226-232, doi: 10.1109/VMIC.1989. 78025 (Year: 1989).*
(Continued)

*Primary Examiner* — Sitaramarao S Yechuri
(74) *Attorney, Agent, or Firm* — The Roy Gross Law Firm, LLC; Roy Gross

(57) ABSTRACT

An array substrate includes a substrate, a first metal layer and an active layer disposed on the substrate, an interlayer insulating layer, and a second metal layer. The first metal layer forms at least one first trace, the interlayer insulating layer is disposed on the first metal layer and the active layer, the second metal layer is disposed on the interlayer insulat-
(Continued)

ing layer, the interlayer insulating layer is formed with a first contact hole, and the second metal layer is connected to the first trace through the first contact hole. The first metal layer includes a conductive layer and a first protective layer stacked in sequence.

8 Claims, 5 Drawing Sheets

(58) Field of Classification Search
CPC .......... H01L 27/1259; H01L 29/78675; H01L 29/66757
See application file for complete search history.

(56) References Cited

U.S. PATENT DOCUMENTS

| 2015/0102344 | A1 | 4/2015 | Song et al. | |
| 2015/0295092 | A1* | 10/2015 | Misaki | H01L 27/124 257/43 |
| 2019/0099855 | A1* | 4/2019 | Arifuku | B24B 37/22 |
| 2019/0115369 | A1 | 4/2019 | Lee et al. | |
| 2020/0091198 | A1* | 3/2020 | Peng | H01L 21/425 |
| 2021/0202600 | A1* | 7/2021 | Wang | H10K 59/353 |
| 2021/0243858 | A1* | 8/2021 | Nagao | H01K 1/04 |
| 2022/0068873 | A1* | 3/2022 | Yuan | H01L 24/16 |

FOREIGN PATENT DOCUMENTS

| CN | 110277420 A | * | 9/2019 | ............ H01L 21/84 |
| CN | 110459505 A | | 11/2019 | |
| CN | 111490076 A | | 8/2020 | |
| JP | 2000155332 A | | 6/2000 | |
| JP | 2003158249 A | | 5/2003 | |

OTHER PUBLICATIONS

J. R. Pfiester et al., "A TiN strapped polysilicon gate cobalt salicide CMOS process," International Technical Digest on Electron Devices, San Francisco, CA, USA, 1990, pp. 241-244 (Year: 1990).*

* cited by examiner

ARRAY SUBSTRATE

CROSS REFERENCE TO RELATED APPLICATIONS

This application is a National Phase of PCT Patent Application No. PCT/CN2021/075385 having International filing date of Feb. 5, 2021, which claims the benefit of priority of Chinese Patent Application No. 202110097489.9, filed Jan. 25, 2021, the contents of which are all incorporated herein by reference in their entirety.

FIELD OF INVENTION

The present application relates to the field of display technology, and in particular to an array substrate.

BACKGROUND OF INVENTION

First metal layer traces of low temperature polysilicon thin film transistor (LTPS TFT) products are limited by a subsequent high temperature process. At present, most of the mass-produced products in the industry use molybdenum metal, but resistance of molybdenum metal is relatively high. Meanwhile, high-resolution, high-frequency medium- and large-sized products have a higher demand for low-resistance metals. At present, high-temperature resistant metal materials can be found to replace molybdenum metal and configured to form traces of the first metal layer, such as patch cords, which maintain low resistance even at high temperatures. However, the first metal layer fabricated in this way is prone to hillock phenomenon at high temperature, which may cause adjacent traces or traces between upper and lower film layers to be shorted together.

In the conventional art, titanium metal is generally covered on high temperature resistant metal to suppress a formation of hillocks, and it achieves a good suppression effect. But titanium metal is not resistant against corrosion of hydrofluoric acid cleaning solution in a subsequent process, thereby affecting stability of an LTPS process.

SUMMARY OF INVENTION

Technical Problem

An embodiment of the present invention provides an array substrate and a manufacturing method thereof, so as to solve a technical problem affecting product quality that covering a titanium metal on a metal material with high temperature resistance and low resistance to prevent the metal material from generating hillocks at high temperatures, but the titanium metal is not resistant to corrosion by hydrofluoric acid cleaning solutions.

Technical Solutions

To solve the above problem, a technical solution provided by the present invention is as follows.

An embodiment of the present invention provides an array substrate, including a substrate, and a first metal layer, an active layer, an interlayer insulating layer, and a second metal layer disposed on the substrate. Wherein the first metal layer forms at least one first trace, the interlayer insulating layer is disposed on the first metal layer and the active layer. The second metal layer is disposed on the interlayer insulating layer, wherein the interlayer insulating layer is defined with a first contact hole, and the second metal layer is connected to the first trace through the first contact hole. Wherein the first metal layer includes a conductive layer and a first protective layer sequentially stacked in a direction away from the substrate; a thermal expansion coefficient of the first protective layer is less than a thermal expansion coefficient of the conductive layer; and the first metal layer further includes a second protective layer disposed on a side of the conductive layer facing the substrate.

In at least one embodiment of the present invention, the thermal expansion coefficient of the first protective layer is less than or equal to $1.7 \times 10^{-6} K^{-1}$.

In at least one embodiment of the present invention, a Mohs hardness of the first protective layer is greater than or equal to 5.5.

In at least one embodiment of the present invention, a material of the first protective layer is any one of Mo, MoNb, TiN, MoN, W, or Ni—Cu.

In at least one embodiment of the present invention, a thickness of the first protective layer ranges from 200 to 1000 angstroms.

In at least one embodiment of the present invention, a thickness of the conductive layer ranges from 1000 to 6000 angstroms.

In at least one embodiment of the present invention, the array substrate includes a display region and a non-display region surrounding the display region, and the at least one first trace is positioned in the non-display region or the display region.

In at least one embodiment of the present invention, the second metal layer forms at least one second trace, and the at least one second trace is connected to the at least one first trace through the first contact hole.

An embodiment of the present invention further provides an array substrate, including a substrate, and a first metal layer, an active layer, an interlayer insulating layer, and a second metal layer disposed on the substrate. Wherein the first metal layer forms at least one first trace, the interlayer insulating layer is disposed on the first metal layer and the active layer. The second metal layer is disposed on the interlayer insulating layer, wherein the interlayer insulating layer is defined with a first contact hole, and the second metal layer is connected to the first trace through the first contact hole. Wherein the first metal layer includes a conductive layer and a first protective layer sequentially stacked in a direction away from the substrate.

In at least one embodiment of the present invention, a thermal expansion coefficient of the first protective layer is less than a thermal expansion coefficient of the conductive layer.

In at least one embodiment of the present invention, the thermal expansion coefficient of the first protective layer is less than or equal to $1.7 \times 10^{-6} K^{-1}$.

In at least one embodiment of the present invention, a Mohs hardness of the first protective layer is greater than or equal to 5.5.

In at least one embodiment of the present invention, a material of the first protective layer is any one of Mo, MoNb, TiN, MoN, W, or Ni—Cu.

In at least one embodiment of the present invention, a thickness of the first protective layer ranges from 200 to 1000 angstroms.

In at least one embodiment of the present invention, a thickness of the conductive layer ranges from 1000 to 6000 angstroms.

In at least one embodiment of the present invention, the first metal layer further includes a second protective layer disposed on a side of the conductive layer facing the substrate.

In at least one embodiment of the present invention, the array substrate includes a display region and a non-display region surrounding the display region, and the at least one first trace is positioned in the non-display region or the display region.

In at least one embodiment of the present invention, the second metal layer forms at least one second trace, and the at least one second trace is connected to the at least one first trace through the first contact hole.

In at least one embodiment of the present invention, further including a gate insulating layer covering the first metal layer, wherein the active layer is disposed on the gate insulating layer, and the interlayer insulating layer is disposed on the active layer.

In at least one embodiment of the present invention, further including a gate insulating layer disposed on the active layer, wherein the first metal layer is disposed on the gate insulating layer, and the interlayer insulating layer is disposed on the first metal layer.

Beneficial Effect

By replacing the molybdenum material of the first metal layer with a composite material of a laminated conductive layer and a protective layer, this not only ensures a conductivity of the first metal layer at high temperatures, but also suppresses a hillock phenomenon. In addition, the manufacturing method provided by the embodiment of the present invention can also prevent the protective layer from corroding by hydrofluoric acid in the subsequent manufacturing process, thereby improving stability of a low-temperature polysilicon manufacturing process and the quality of products.

DETAILED DESCRIPTION OF EMBODIMENTS

The present invention aims at a conventional array substrate, because a first metal layer is prone to produce hillock phenomenon at high temperature, adjacent connection lines or the connection lines between upper and lower film layers may be shorted together, thereby affecting the display. The present embodiment is proposed to overcome this defect.

Figure 1:
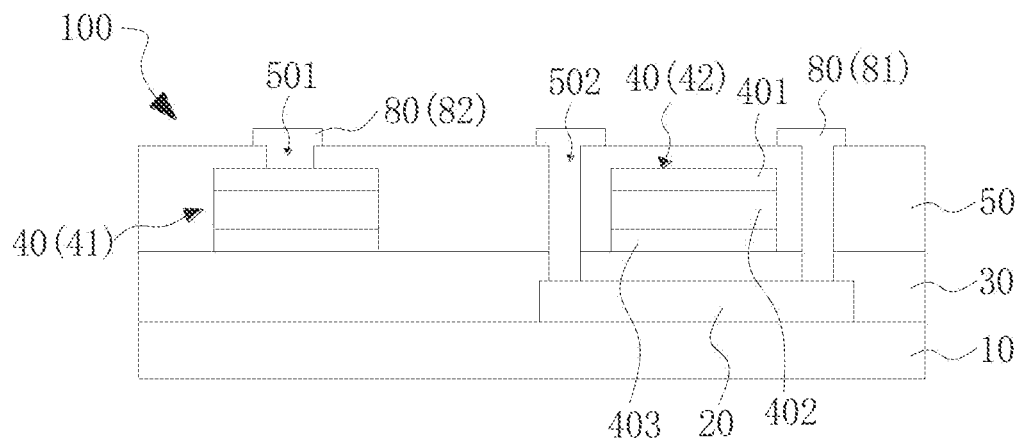
FIG. 1 is a schematic structural diagram of an array substrate according to an embodiment of the present invention.

Refer to FIG. 1, an embodiment of the present invention provides an array substrate 100. The array substrate 100 includes a display region and a non-display region surrounding the display region. The array substrate 100 includes a substrate 10, a first metal layer 40, an active layer 20, and a second metal layer 80.

Wherein, the first metal layer 40 forms at least one first trace 41. Specifically, the first metal layer 40 can be configured to form gates, scan lines, and other traces. In the present embodiment, the first metal layer 40 includes a first trace 41 and a gate 42.

The second metal layer 80 forms at least one second trace 82. Specifically, the second metal layer 80 can be configured to form a source, a drain, a data line, and other traces. In the present embodiment, the second metal layer 80 includes a source-drain layer 81 and a second trace 82 The source-drain layer 81 includes a source and a drain.

The first trace 41 can be positioned in the display region or the non-display region. The first trace 41 and the second trace 82 are configured to layout on the array substrate 10 which have different functions and need to be bridged across film layers. The first trace 41 and the second trace 82 are electrically connected to each other through contact holes. For example, the second trace 82 can be a fan-out trace in the non-display region, and the first trace 41 can be a patch cord in the non-display region. Alternatively, the second trace 82 is the patch cord, and the first trace 41 is the fan-out trace. In other embodiments, the first trace 41 can be a scan line in the display region, and the second trace 42 can be a transfer line connected to a gate driving circuit.

The array substrate 100 includes a plurality of thin film transistors disposed in an array. The thin film transistors described in the embodiment of the present invention can be low temperature polysilicon thin film transistors, and the active layer 20 can be a polysilicon layer. Each of the thin film transistors includes the active layer 20, the gate 42, and the source-drain layer 81.

The second trace 82 and the first trace 41 can be positioned in the non-display region of the array substrate 100, and the second trace 82 can be connected to the first trace 41 through a corresponding contact hole to form a peripheral trace of the non-display region. In other embodiments, the first trace 41 can be positioned in the display region of the array substrate 100, and the second trace 82 is connected to the first trace 41 in the display region through a corresponding contact hole.

In the conventional manufacturing process, polysilicon in the active layer 20 needs to be activated and hydrogenated to repair structural defects, thereby improving electrical properties of the thin film transistor. Since activation and hydrogenation processes need to be performed at high temperatures, the first metal layer 40 needs to withstand high-temperature manufacturing processes. The first metal layer 40 in the conventional art is generally molybdenum metal, but a resistance of molybdenum metal is relatively high, which is not suitable for high-resolution and high-frequency medium and large-sized products that require low-resistance metals. At present, a material with high temperature resistance and low resistivity can be found to replace molybdenum metal, but the first metal layer 40 made of this material is prone to hillock phenomenon at high temperature, resulting in adjacent traces formed by the first metal layer 40 to be easily shorted together.

Therefore, the first metal layer 40 provided by the embodiment of the present invention is a composite film layer, and a protective layer is covered on the conductive layer to suppress the generation of hillocks.

Specifically, the first metal layer 40 includes a conductive layer 402 and a first protective layer 401 stacked in a direction away from the substrate 10, wherein a material of the first protective layer 401 is also a conductive material.

The conductive layer 402 has characteristics of high temperature resistance and low resistivity. The high temperature resistance of the conductive layer 402 can range from 450° C. to 600° C. According to simulation and actual measurement results, the resistivity of the conductive layer 402 can be selected from 4.5 to 7.5. microohm·cm (µΩ·cm).

Specifically, a material of the conductive layer 402 can be aluminum alloy, and specifically can be a material whose main body is aluminum and doped with other elements such as Nd, Ge, Ta, or Zr.

The array substrate 100 further includes an interlayer insulating layer 50, the interlayer insulating layer 50 is disposed on the first metal layer 40 and the active layer 20, and the second metal layer 80 is disposed on the interlayer insulating layer 50.

Figure 10:
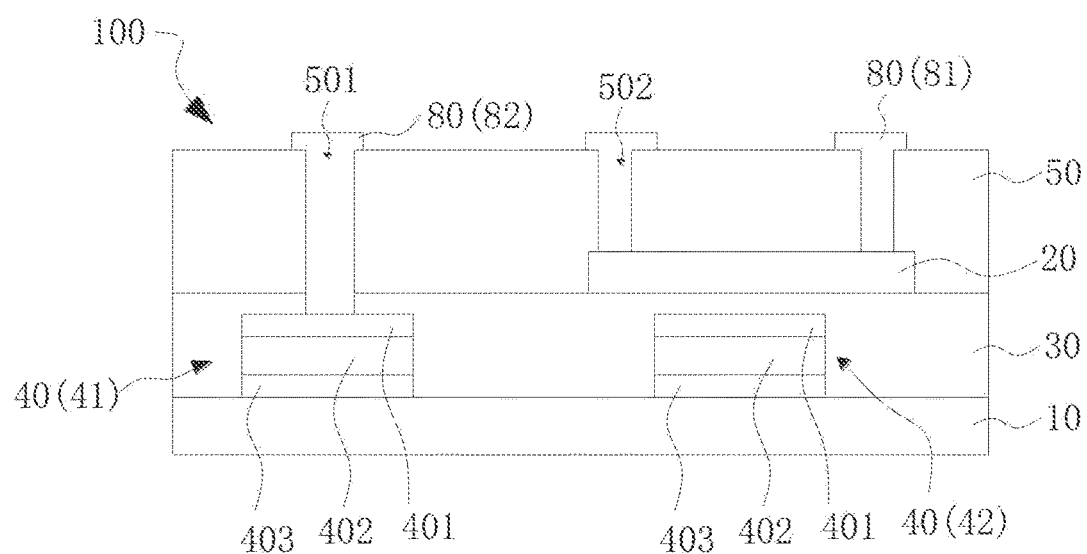
FIG. 10 is a schematic structural diagram of an array substrate according to another embodiment of the present invention.

A gate insulating layer 30 is disposed between the first metal layer 40 and the active layer 20, and the thin film transistor can be a top gate structure or a bottom gate structure. When the thin film transistor is the bottom gate structure, the first metal layer 40 is disposed on a side of the active layer 20 close to the substrate 10, and the gate insulating layer 30 is disposed on the first metal layer 40, the active layer 20 is disposed on the gate insulating layer 30, and the interlayer insulating layer 50 is disposed on the active layer 20, as shown in FIG. 10. When the thin film transistor is the top gate structure, the first metal layer 40 is disposed on a side of the active layer 20 away from the substrate 10, the gate insulating layer 30 is disposed on the active layer 30, the second metal layer 40 is disposed on the gate insulating layer 30, and the interlayer insulating layer 50 is disposed on the first metal layer 40, as shown in FIG. 1.

A first contact hole 501 is formed on a side of the first trace 41 away from the substrate 10, and a second contact hole 80 is formed on the side of the active layer 20 away from the substrate.

The second metal layer 80 is connected to the first trace 41 through the first contact hole 501, and is connected to the active layer 20 through the second contact hole 502.

Specifically, the second trace 82 is connected to the first trace 41 through the first contact hole 501, and the source-drain layer 81 is connected to the active layer 20 through the second contact hole 502.

Specifically, the source and the drain in the source-drain layer 81 are connected to the active layer 20 through a corresponding second contact hole 502, respectively.

Refer to FIG. 1, in an embodiment, the gate insulating layer 30 is disposed on the active layer 20, the first metal layer 40 is disposed on the gate insulating layer 30, and the interlayer insulating layer 50 is disposed on the first metal layer 40.

Specifically, the first contact hole 501 passes through the interlayer insulating layer 50 to expose at least part of a surface of the first trace 41, and the second contact hole 502 passes through the interlayer insulating layer 50 and the gate insulating layer 30 in sequence to expose part of a surface of the active layer 20.

In another embodiment, refer to FIG. 10, of which the difference from FIG. 1 is that the first metal layer 40 is disposed on the side of the active layer close to the substrate 10, and other structures are same or similar as those in FIG. 1.

Specifically, the first metal layer 40 is disposed on the substrate 10, the gate insulating layer 30 covers the first metal layer 40, the active layer 20 is disposed on the gate insulating layer 30, and the interlayer insulating layer 50 is disposed on the active layer. The first contact hole 501 sequentially passes through the interlayer insulating layer 50 and the gate insulating layer 30 to expose a part of the surface of the first trace 41. The second contact hole 502 passes through the interlayer insulating layer 50 to expose a part of the surface of the active layer 20. Other structures can be referred to the description of FIG. 1.

Refer to FIG. 1. in an embodiment, the first metal layer 40 further includes a second protective layer 403, and the second protective layer 403 is formed on a side of the conductive layer 402 facing the substrate 10, so as to prevent ions of the conductive layer 402 from diffusing to a lower layer, affecting electrical properties of the thin film transistor.

Refer to FIG. 1, specifically, the second protective layer 403 is disposed between the active layer 20 and the conductive layer 402 to prevent ions of the conductive layer 402 from diffusing to the active layer 20.

Materials of the first protective layer 401 and the second protective layer 402 can be same or different.

Since a process of forming the first via 501 requires etching and cleaning processes, acidic solutions are generally used as cleaning solutions, such as hydrofluoric acid, sulfuric acid, or nitric acid. Therefore, the first protective layer 401 should be selected from materials that have excellent chemical stability and are not easy to lose electrons, and the materials also need to have a performance of inhibiting the conductive layer 402 from generating hillocks at high temperatures. Therefore, thermal expansion coefficient of the first protective layer 401 in the present embodiment needs to be less than thermal expansion coefficient of the conductive layer 402.

Furthermore, the first protective layer 401 has excellent hardness so as to be able to resist a deformation of the conductive layer 403 in the lower layer, and a Mohs hardness of the first protective layer 401 is greater than or equal to 5.5.

A thickness of the first protective layer ranges from 200 to 1000 angstroms. Within this thickness range, the first protective layer can prevent the conductive layer from corroding while having good resistance to hydrofluoric acid corrosion. A preferred thickness range of the first protective layer in the present embodiment is 200 to 800 angstroms.

In an embodiment, the thermal expansion coefficient of the first protective layer 401 is less than or equal to $1.7\times10^{-6}K^{-1}$, so as to ensure that the first protective layer 401 can suppress a formation of hillocks on the conductive layer 402 below, and can also ensure that it does not produce hillocks at high temperatures.

In an embodiment, a material of the first protective layer 401 can be any one of Mo, MoNb, TiN, MoN, W, or Ni—Cu, or can also be other materials with a smaller thermal expansion coefficient.

A thickness of the conductive layer 402 ranges from 1000 to 6000 angstroms, and the thickness of the conductive layer in the present embodiment is preferably 1500 angstroms.

In an embodiment, the thickness of the second protective layer 403 ranges from 200 to 1000 angstroms.

Chemical activity of the second protective layer is less than the chemical activity of the conductive layer 402, so that it can effectively block diffusion of ions in the conductive layer 402. The second protection can be made of materials with better compactness and lower chemical activity, such as Ti materials, or other materials.

Figure 2:
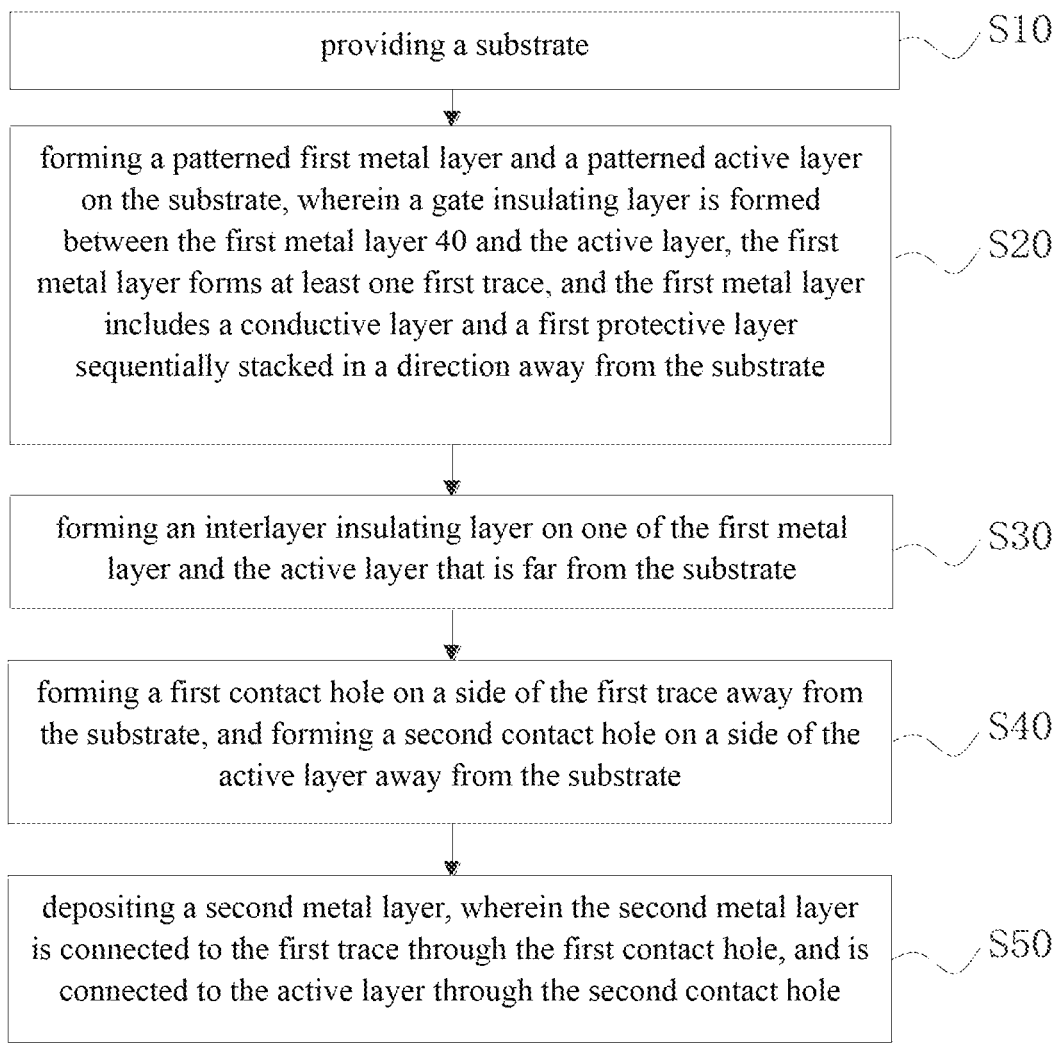
FIG. 2 is a flow chart of steps of a method of manufacturing an array substrate according to an embodiment of the present invention.

Refer to FIG. 2, based on the array substrate 100 in the abovementioned embodiment, an embodiment of the present invention further provides a method of manufacturing the abovementioned array substrate 100, including:

S10, providing a substrate 10;

S20, forming a patterned first metal layer 40 and a patterned active layer 20 on the substrate 10, wherein a gate insulating layer 30 is formed between the first metal layer 40 and the active layer 20, the first metal layer 40 forms at least one first trace 41, and the first metal layer 40 includes a conductive layer 402 and a first protective layer 401 that are sequentially stacked in a direction away from the substrate 10;

S30, forming an interlayer insulating layer 50 on one of the first metal layer 40 and the active layer 20 that is far from the substrate 10;

S40, forming a first contact hole 501 on a side of the first trace 41 away from the substrate 10, and forming a second contact hole 502 on a side of the active layer 20 away from the substrate 10;

S50, depositing a second metal layer 80, wherein the second metal layer is connected to the first trace 41 through the first contact hole 501, and is connected to the active layer 20 through the second contact hole 502.

Figure 3:
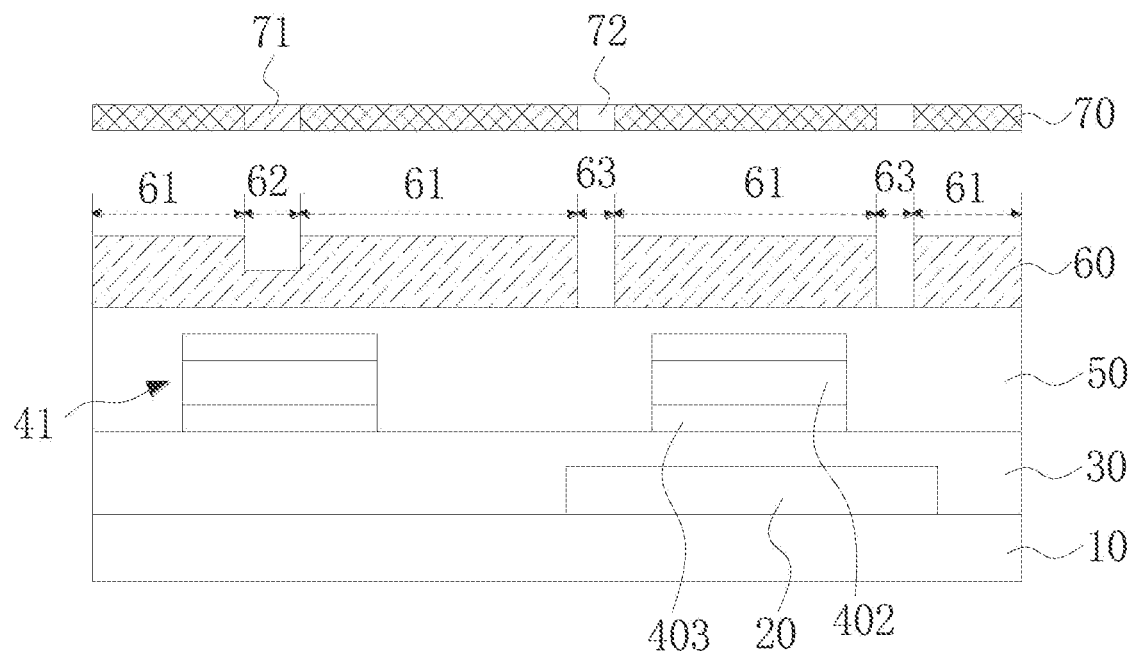
FIG. 3 is a schematic structural diagram of an interlayer insulating layer covered with a photoresist layer according to an embodiment of the present invention.

Refer to FIG. 3, the S20 includes sequentially forming the active layer 20, and the gate insulating layer 30 and the first metal layer 40 covering the active layer 20 on the substrate 10.

The material of the first protective layer can be any one of Ti, Mo, MoNb, TiN, MoN, W, or Ni—Cu.

A material of the interlayer insulating layer 50 can be an inorganic material such as SiNx.

In the process of forming the first contact hole 501 and the second contact hole 502, the interlayer insulating layer 50 and the gate insulating layer 30 need to be etched and cleaned. After the etching is completed, all the layers are exposed. After a part of a surface of the first protective layer 401 of the first trace 41, when the first contact hole 501 and the second contact hole 502 are cleaned, the Ti metal is not resistant to hydrofluoric acid cleaning solution. Therefore, the first protective layer 401 of the first trace 41 can be prevented from corrosion through an improved photomask process.

Figure 4:
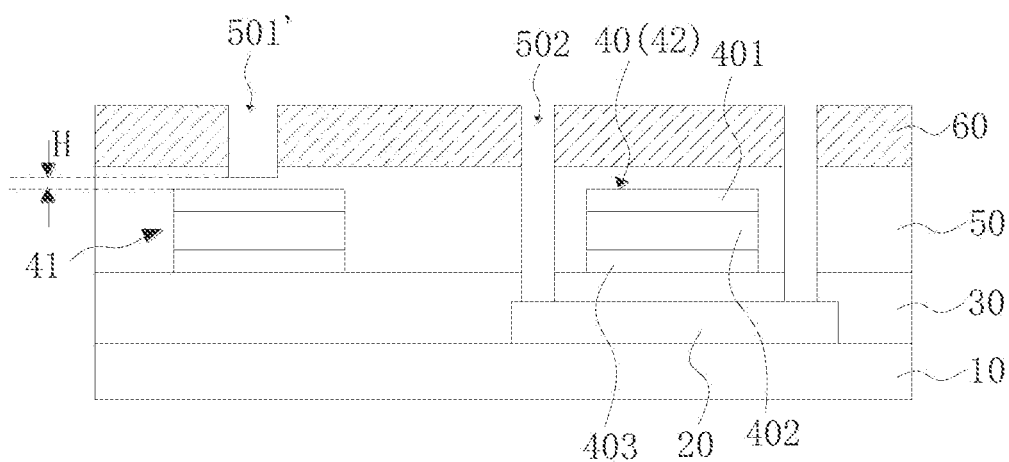
FIG. 4 is a schematic structural diagram of a recessed hole formed above a first trace according to an embodiment of the present invention.

Refer to FIG. 4, when the first protective layer is made of Ti material, during etching, a part of the interlayer insulating layer 50 above the first trace 41 can be retained, and the interlayer insulating layer 50 above the first trace 41 is not completely etched away, so that after the etching is completed, there is a preset distance H between a bottom of the first contact hole 501 and a top of the first trace 41. During cleaning, remaining part of the interlayer insulating layer 50 at the first contact hole 501 is consumed by the hydrofluoric acid solution, and finally exposed Ti is barely corroded by the hydrofluoric acid solution.

Specifically, refer to FIG. 3 to FIG. 6, the S40 includes as follows.

Refer to FIG. 3, S401, a photoresist layer 60 of different thicknesses is formed on the interlayer insulating layer 50 using a mask plate 70 with different light transmittance. Wherein, the photoresist layer 60 includes a photoresist fully reserved region 61, a photoresist partially reserved region 62, and a photoresist unreserved region 63, and the photoresist partially reserved region 62 corresponds to at least a part of the first trace 41, the photoresist unreserved region 63 corresponds to a part of the active layer 20.

Specifically, photoresist is coated on the interlayer insulating layer 50, and the photoresist is exposed by using the mask plate 70, wherein the mask plate 70 includes a fully transparent region 72 and a translucent region 71. A light transmittance of the fully transparent region 72 is 100%, and the light transmittance of the translucent region 71 is 30% to 60% and is preferably 50% in the present embodiment. Amount of exposure can be controlled at 20 to 50 megajoules (MJ).

The photoresist in the present embodiment is a positive photoresist. After exposure, the photoresist is developed to obtain the photoresist layer 60 with different thicknesses. In other embodiments, the photoresist layer 60 can be a negative photoresist. However, it should be ensured that after exposure and development, the photoresist completely reserved region 61 corresponds to the first trace 41, and the photoresist unreserved region 63 corresponds to the active layer 20.

Refer to FIG. 4, S402, the interlayer insulating layer 50 and the gate insulating layer 30 are etched to form a recessed hole 501' positioned corresponding to the first trace 41 and a second contact hole 502 positioned corresponding to the active layer 20. Wherein, a preset distance H is formed between a bottom of the recessed hole 501' and the top of the first trace 41.

The preset distance H can range from 50 to 100 angstroms, that is, after etching, the thickness of the interlayer insulating layer 50 remaining above the first trace 41 is 50 to 100 angstroms.

The etching process in the present embodiment can be a dry etching process. Since a part of the photoresist remains corresponding to the first trace 41, and no photoresist remains corresponding to the active layer 20, therefore, during the etching process, the photoresist above the first trace 41 and a part of film of the interlayer insulating layer 50 are etched away, a part of the interlayer insulating layer 50 above the first trace 41 is retained, the first contact hole 501 is not completely etched through, and the active layer 20 corresponding to the second contact hole 502 is completely etched through.

Figure 5:
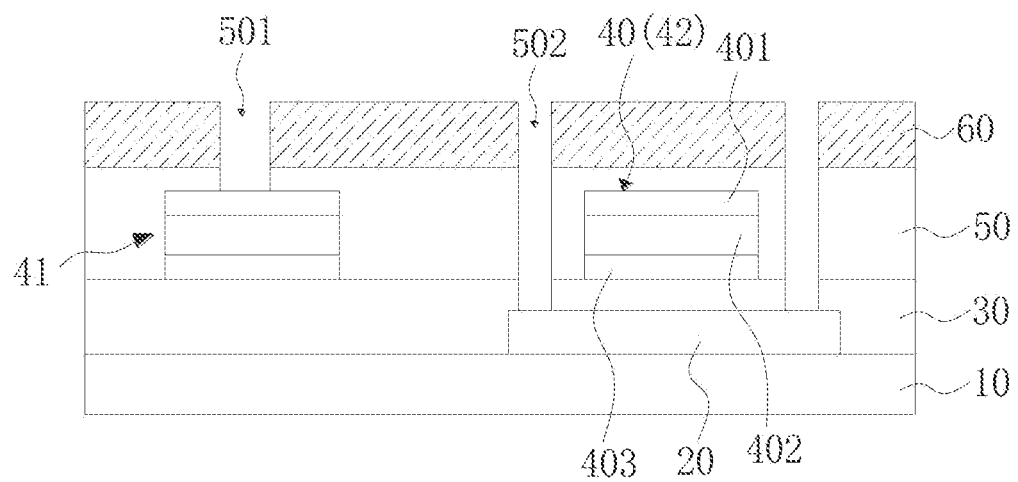
FIG. 5 is a schematic structural diagram of a first contact hole formed after cleaning according to an embodiment of the present invention.

Refer to FIG. 5, S403, using hydrofluoric acid solution to clean the recessed hole 501' and the second contact hole 502. Wherein, the interlayer insulating layer 50 positioned between the top of the first trace 41 and the bottom of the recessed hole 501' is completely removed to eliminate the preset distance H, so that the first contact hole 501 is formed after the recessed hole 501' is deepened.

In the process of cleaning the recessed hole 501', the hydrofluoric acid chemically reacts with the material of the interlayer insulating layer 50 at the recessed hole 501', thereby consuming the material of the interlayer insulating layer positioned on the top of the first trace 41, and further exposes a part of the surface of the first trace 41.

Specifically, the hydrofluoric acid solution with a mass content of 1% hydrofluoric acid can be used for cleaning, and a cleaning time can be controlled within 30-40 seconds, so that the interlayer insulating layer 50 remaining at the first contact hole 501 is consumed, so that an exposed first protective layer 401 is barely corroded by the hydrofluoric acid solution.

Figure 6:
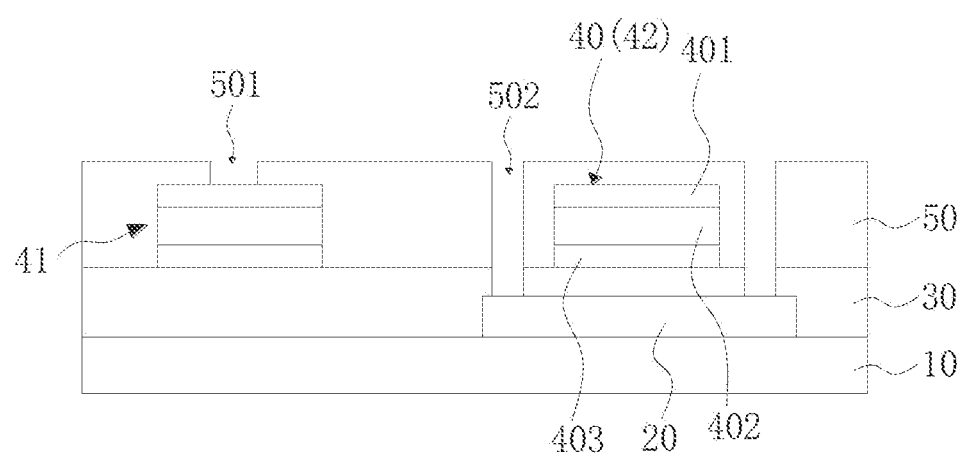
FIG. 6 is a schematic structural diagram of the array substrate after removing the photoresist layer according to an embodiment of the present invention.

Refer to FIG. 6, the S40 further includes stripping the photoresist layer 60 after the cleaning is completed.

Refer to FIG. 1, specifically, in the S50, a metal layer is deposited on the interlayer insulating layer 50, and a patterning process is performed to form a patterned second metal layer 501. The second trace 82 is formed in the first contact hole 501, so that the second trace 82 is connected to the first trace 41 through the first contact hole 501. The source-drain layer 81 is formed in the second contact hole 502, so that the source-drain layer 81 is connected to the active layer 20 through the second contact hole 502.

Figure 7:
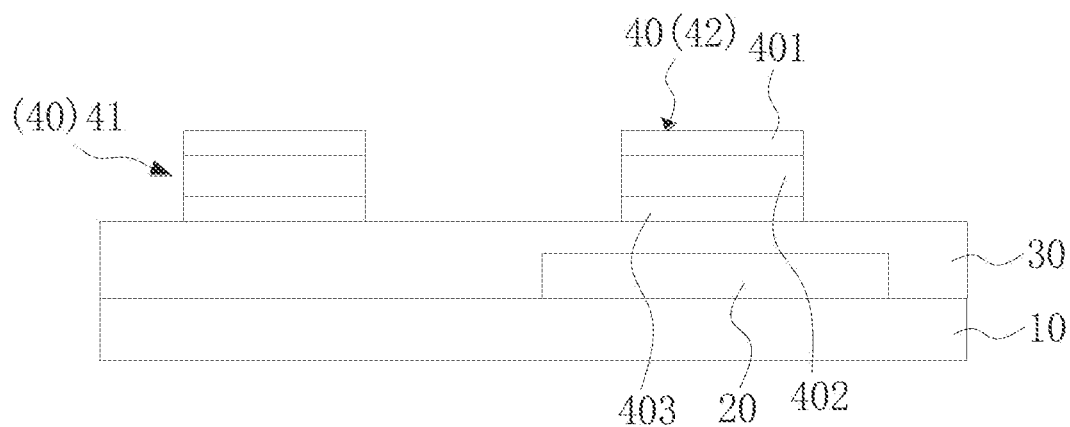
FIG. 7 is a schematic structural diagram of a first metal layer according to other embodiments of the present invention.

Refer to FIG. 7, in the S20, a formation of the first metal layer 40 includes sequentially forming the conductive layer 402 and the first protective layer 401 on the gate insulating layer 30.

Specifically, in S20, after sequentially depositing a material of the conductive layer 402 and a material of the first protective layer 401, a patterning process is performed on the conductive layer 402 and the first protective layer 401 to form the patterned first metal layer 40. That is, the first trace 41 and the gate 42 are formed at corresponding positions.

The formation of the first metal layer 40 can also include a manufacturing of a second protective layer 403. After the second protective layer 403 is formed on the gate insulating layer 30, the conductive layer 402 and the first protective layer 401 are sequentially formed.

In the above manufacturing method, a material of the second protective layer 403 can be Ti, a material of the conductive layer 402 can be aluminum alloy, and a material of the first protective layer 401 can be Ti.

In other embodiments, the material of the first protective layer 401 can be Mo, MoNb, TiN, MoN, W, or Ni—Cu. These materials have good hydrofluoric acid corrosion resistance. The first protective layer 401 can be formed by plasma chemical vapor deposition method, or can be formed by physical vapor deposition method.

Taking TiN as an example for description, specifically, the S20 includes forming the conductive layer 402 on the interlayer insulating layer 50, depositing a titanium metal layer on the conductive layer 402, and dissociating N2 into plasma by using a plasma chemical vapor deposition method, and the plasma reacts with titanium to generate TiN to form the first protective layer 401.

Specifically, under certain power and pressure conditions, under N2 and NH3 atmospheres, N2 dissociates into plasma, which bombards titanium, and then reacts with titanium to generate TiN. When a molar ratio of N in the TiN is 60-90%, the TiN film layer formed is better. A film thickness of the TiN and the conductive layer is not limited, and is designed according to resistance requirements of actual products.

The formation of the first metal layer 40 can also include a manufacturing of the second protective layer 403, which will not be repeated here.

In other embodiments, the S20 includes forming the conductive layer 402 on the interlayer insulating layer 50, and depositing a titanium metal layer on the conductive layer 402, wherein the titanium metal layer is deposited on the conductive layer 402 in a N2 and inert gas environment, and a TiN film layer is formed by physical vapor deposition to form a first protective layer 401.

Specifically, in a same chamber, a reactive gas N2 and an inert gas, such as argon gas, are introduced in advance, a titanium metal target is sputtered, and a titanium film and a TiN film are continuously and stably formed.

Figure 8:
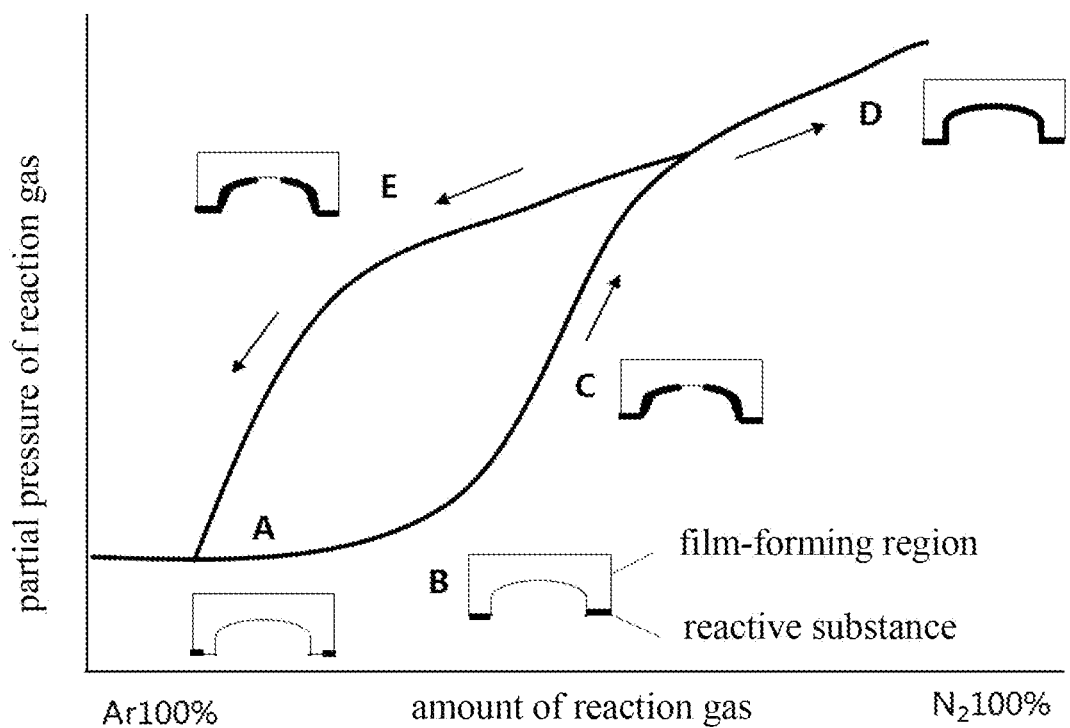
FIG. 8 is a graph of a TiN film fabricated by a physical vapor deposition method according to other embodiments of the present invention.

Refer to FIG. 8, the abscissa in FIG. 8 is amount of reaction gas, and the ordinate is partial pressure of the reaction gas. Experiments show that on a surface of the titanium metal target, when the titanium metal is transformed into TiN, a sputtering power and a ratio of the reactive gas N2 and the inert gas must be moderate to ensure better film formation in a film-forming region. Point A and point B indicate that the TiNX film is slightly formed in a non-film-forming region, point C and point D indicate that the TiNX film is formed in the film-forming region, point D indicates that the TiNX film is completely covered in the film-forming region, and point D is in a state of excess the reactive gas N2. Therefore, the TiNX film can completely cover the film-forming region under a condition of excess the reactive gas N2.

When the first protective layer is made of MoN material, the manufacturing method is same as the above process, the abovementioned plasma chemical vapor deposition method or physical vapor deposition method can be adopted, and only the titanium metal needs to be replaced with molybdenum metal in the deposition process. Details are not described herein again.

After the first protective layer 401 made of TiN is formed, the interlayer insulating layer 50 is covered on the first metal layer 40.

Since the material of the first protective layer 401 is TiN or other materials which resistant to hydrofluoric acid corrosion, the first protective layer 401 will not be corroded by the hydrofluoric acid cleaning solution in the subsequent process. Therefore, when the first contact hole 501 and the second contact hole 502 are formed, they can be directly etched in place in one step. That is, after the etching is completed, the first contact hole 501 can directly expose a part of a surface of the first trace 41.

Figure 9:
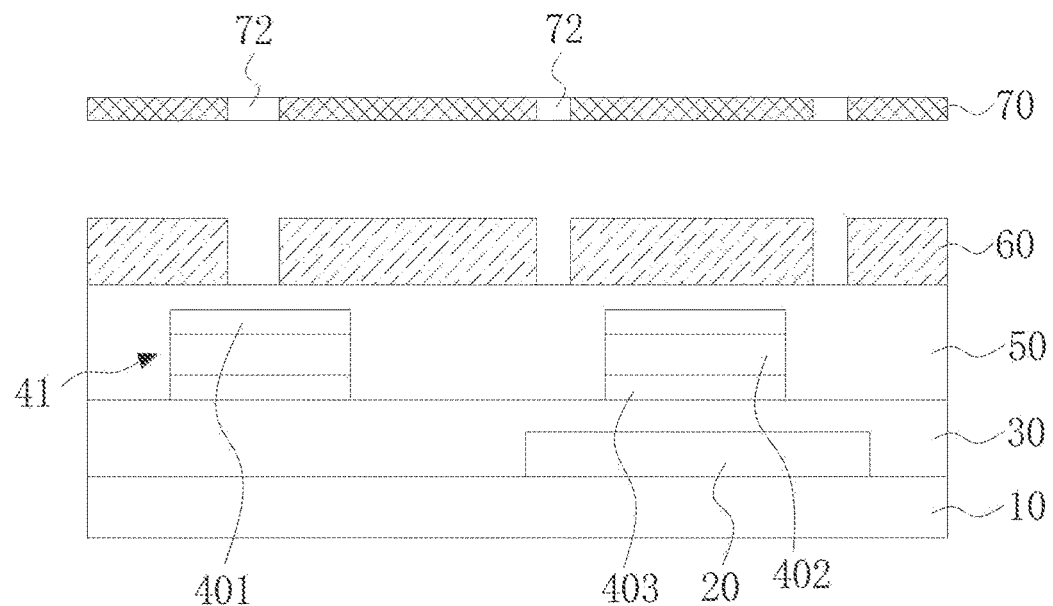
FIG. 9 is a schematic structural diagram of a manufacturing process of the array substrate according to other embodiments of the present invention.

Specifically, refer to FIG. 9, in the S40, first, a patterned photoresist layer 60 is formed on the interlayer insulating layer by using a mask plate 70.

Wherein, the mask plate 70 includes a fully transparent region 72 corresponding to the first trace 41 and the active layer 20. The photoresist layer 60 includes a photoresist reserved region and a photoresist unreserved region, the photoresist unreserved region corresponds to the fully transparent region 72.

Refer to FIG. 5, then, the interlayer insulating layer 50 and the gate insulating layer 30 are etched to form a first contact hole 501 and a second contact hole 502. The first contact hole 501 exposes a part of a surface of the first trace 41, and the second contact hole 502 exposes a part of a surface of the active layer 20.

Then, the first contact hole 501 and the second contact hole 502 are cleaned with a hydrofluoric acid solution. After the cleaning, the photoresist layer 60 is removed, as shown in FIG. 6.

Refer to FIG. 10, when the thin film transistor is a bottom gate structure, a material of the first protective layer 401 can be Mo, MoNb, TiN, MoN, W, or Ni—Cu, etc. These materials have good resistance to hydrofluoric acid corrosion. The first protective layer 401 can also be formed by the plasma chemical vapor deposition method or the physical vapor deposition method in the abovementioned embodiments, and details are not described herein again.

In the premise of no modification of the machine, no increase in the process of the mask, the first metal layer provided in the present embodiment for medium and large-sized products can not only meet electrical conductivity requirements at high temperatures, but also prevent from corrosion by hydrofluoric acid in the subsequent process, thereby enhancing the competitiveness of array substrates used in low-temperature polysilicon panels.

A light-shielding layer can be further disposed between the active layer 20 and the substrate 10, and a projection of the active layer 20 on the substrate 10 is positioned within an orthographic projection of the light-shielding layer on the substrate 10. The light-shielding layer has a light-shielding function to prevent ambient light from irradiating the active layer 20 and affecting the electrical properties of the thin film transistor.

The present invention, by replacing the molybdenum material of the first metal layer with a composite material of a laminated conductive layer and a protective layer, not only ensures a conductivity of the first metal layer at high temperatures, but also suppresses a hillock phenomenon. In addition, the manufacturing method provided by the embodiment of the present invention can also prevent the protective layer from corrosion by hydrofluoric acid in the subsequent manufacturing process, thereby improving stability of a low-temperature polysilicon manufacturing process and the quality of products.

In the abovementioned embodiments, the description of each embodiment has its own focus. For parts that are not described in detail in an embodiment, reference can be made to related descriptions of other embodiments.

An array substrate provided in the embodiments of the present invention have been described in detail above. Specific embodiments have been used in this document to explain the principle and implementation of the present application. The descriptions of the above embodiments are only used to help understand the technical solution of the present application and its core ideas. For a person skilled in the art, any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. An array substrate, comprising:
    a substrate;
    an active layer disposed on the substrate;
    a first metal layer disposed on the active layer, wherein the first metal layer comprises a first trace and a gate corresponding to the active layer;
    an interlayer insulating layer disposed on the first metal layer, wherein a first contact hole is defined in the interlayer insulating layer to expose at least part of a surface of the first trace, two second contact holes are defined in the interlayer insulating layer to expose part of a surface of the active layer; and
    a second metal layer disposed on the interlayer insulating layer, wherein the second metal layer comprises a second trace, a source, and a drain, and the source and the drain are connected to the active layer through corresponding one of the second contact holes, respectively; and
    wherein the first trace comprises a conductive layer and a first protective layer sequentially stacked in a direction away from the substrate, the first protective layer is located at an outermost layer in the first trace in the direction away from the substrate, a material of the first protective layer is TiN and/or MoN, and the second trace is directly connected to the first protective layer through the first contact hole; and
    the first metal layer further comprises a second protective layer disposed on a side of the conductive layer facing the substrate.

2. The array substrate according to claim 1, wherein a thermal expansion coefficient of the first protective layer is less than a thermal expansion coefficient of the conductive layer.

3. The array substrate according to claim 2, wherein the thermal expansion coefficient of the first protective layer is less than or equal to $1.7 \times 10^{-6} K^{-1}$.

4. The array substrate according to claim 2, wherein a Mohs hardness of the first protective layer is greater than or equal to 5.5.

5. The array substrate according to claim 4, wherein a thickness of the first protective layer ranges from 200 to 1000 angstroms.

6. The array substrate according to claim 5 wherein a thickness of the conductive layer ranges from 1000 to 6000 angstroms.

7. The array substrate according to claim 1, wherein the array substrate further comprises a display region and a non-display region surrounding the display region, and the at least one first trace is positioned in the non-display region or the display region.

8. The array substrate according to claim 1, further comprising a gate insulating layer disposed on the active layer, wherein the first metal layer is disposed on the gate insulating layer, and the interlayer insulating layer is disposed on the first metal layer.

* * * * *